United States Patent
Endo

(10) Patent No.: US 10,809,294 B2
(45) Date of Patent: Oct. 20, 2020

(54) STAGE DEVICE AND PROBE DEVICE

(71) Applicant: TOKYO ELECTRON LIMITED, Tokyo (JP)

(72) Inventor: Tomoya Endo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 250 days.

(21) Appl. No.: 15/928,800

(22) Filed: Mar. 22, 2018

(65) Prior Publication Data

US 2018/0217201 A1  Aug. 2, 2018

Related U.S. Application Data

(63) Continuation of application No. PCT/JP2016/073174, filed on Aug. 5, 2016.

(30) Foreign Application Priority Data

Sep. 24, 2015 (JP) ................. 2015-187289

(51) Int. Cl.
G01R 31/28 (2006.01)
H01L 21/68 (2006.01)
H02K 41/02 (2006.01)
G01R 1/067 (2006.01)
G01R 31/26 (2020.01)

(52) U.S. Cl.
CPC ......... G01R 31/2831 (2013.01); G01R 1/067 (2013.01); G01R 31/2601 (2013.01); H01L 21/68 (2013.01); H02K 41/02 (2013.01)

(58) Field of Classification Search
CPC .................................................. G01R 1/067
See application file for complete search history.

(56) References Cited

U.S. PATENT DOCUMENTS 4,755,746 A * 7/1988 Mallory ............. G01R 31/2831
324/762.05
5,684,856 A  11/1997 Itoh et al.

FOREIGN PATENT DOCUMENTS

| EP | 1655765 A1 | 5/2006 |
| JP | 6252026 A | 9/1994 |
| JP | 2001242937 A | 9/2001 |
| JP | 3540239 B2 | 4/2004 |

(Continued)

OTHER PUBLICATIONS

International Search Report dated Nov. 1, 2016 corresponding to application No. PCT/JP2016/073174.

*Primary Examiner* — Christopher E Mahoney
(74) *Attorney, Agent, or Firm* — Nath, Goldberg & Meyer; Jerald L. Meyer

(57) ABSTRACT

A drive unit of a stage device includes a boxy body having a rectangular shape in a plan view, a base, a pair of X-axis linear motors, and a pair of Y-axis linear motors. An X-axis stator is disposed on each of two mutually opposing X-axis-direction side walls of the boxy body, wherein magnetic attractions that draw respective X-axis rotors toward the X-axis stator side (Y-axis direction) cancel out each other between the pair of X-axis linear motors. A Y-axis stator is disposed on the inside of each of two mutually opposing Y-axis wall members, wherein magnetic attractions that draw respective Y-axis rotors toward the Y-axis stator side (X-axis direction) cancel out each other between the pair of Y-axis linear motors.

8 Claims, 9 Drawing Sheets

(56) References Cited

FOREIGN PATENT DOCUMENTS

| | | | |
|---|---|---|---|
| JP | 2004172557 | A | 6/2004 |
| JP | 2004260117 | A | 9/2004 |
| JP | 2006165345 | A | 6/2006 |
| JP | 2006230127 | A | 8/2006 |
| JP | 201248165 | A | 3/2012 |
| JP | 2013102086 | A | 5/2013 |
| JP | 2014193045 | A | 10/2014 |
| KR | 1020030095327 | A | 12/2013 |
| WO | 2006059634 | A1 | 6/2006 |

* cited by examiner

STAGE DEVICE AND PROBE DEVICE

CROSS-REFERENCE TO RELATED APPLICATION

This application is a Continuation Application of PCT International Application No. PCT/JP2016/073174, filed on Aug. 5, 2016, which claims the benefit of priority from Japanese Patent Application No. 2015-187289, filed on Sep. 24, 2015, the disclosure of which is incorporated herein in its entirety by reference.

TECHNICAL FIELD

The present disclosure relates to a stage device that loads a substrate such as a semiconductor wafer when a device formed on the substrate is inspected, and a probe device including the stage device.

BACKGROUND

In a process of manufacturing a semiconductor device, probe inspection for evaluating the electrical characteristics of a semiconductor device is performed. The probe inspection is performed such that a probe needle is brought into contact with electrodes of the semiconductor device formed on a semiconductor substrate, an electrical signal is input to each individual semiconductor device, and an electrical signal output in response to the input of the electrical signal is observed in order to evaluate the electrical characteristics.

A probe device used for probe inspection includes a stage (loading table) that holds a substrate to be inspected, on which a semiconductor device to be inspected is formed, and that can horizontally and vertically move and rotate, and an alignment device that accurately brings the probe needle into contact with the electrode of the semiconductor device formed on the substrate to be inspected. Next, alignment is performed by moving the stage on which the substrate to be inspected is loaded, in the X, Y, Z, and θ directions, and after alignment, a semiconductor wafer and the probe needle of a probe card are accurately brought into contact with each other using the stage to perform electrical characteristic inspection.

However, in recent years, the weight of the stage has increased with an increase in the diameter of the substrate. In order to drive the stage with a large weight in the X-axis and Y-axis directions, it is preferable to use a core-equipped linear motor with a large thrust. However, the core-equipped linear motor has a problem in that cogging or yawing occurs due to a magnetic attractive force. In order to suppress the occurrence of cogging or yawing, it is conceivable to use a coreless linear motor, but the coreless linear motor has a weak thrust and thus is not suitable for driving the stage with a large weight. When the stage is made lightweight so as to offset the weak thrust of the coreless linear motor, the rigidity of the stage is lowered and thus the structure of the stage becomes low in vibration resistance. There is also a magnetic-attractive-force-canceling-type linear motor, but it is expensive, resulting in an increase in cost.

As a proposal for an XY driving mechanism for the stage, in Patent Document 1 (Japanese Unexamined Patent Publication No. 2014-193045), a probe device has been proposed that includes a linear motor in which a mover is disposed between a pair of guide portions facing each other to cancel out a magnetic attractive force. However, in the structure of Patent Document 1, since a linear motor for driving the stage in the X-axis direction and a linear motor for driving the stage in the Y-axis direction are stacked in the vertical direction (Z-axis direction), vibration of the stage may become large at the time of driving.

Further, in Patent Document 2 (Japanese Unexamined Patent Publication No. 2006-230127), there has been proposed a configuration in which a linear motor for driving the stage in the X-axis direction is disposed between a pair of linear motors for driving the stage in the Y-axis direction. However, in Patent Document 2, the arrangement of the linear motor for suppressing the magnetic attractive force is not considered at all. In addition, since Patent Document 2 relates to a driving mechanism of a relatively light stage in an exposure apparatus and does not require high rigidity, it is difficult to be exclusively applied to the driving mechanism of the stage in a probe device.

SUMMARY

The present disclosure provides some embodiments of a stage device in which the influence of a magnetic attractive force is suppressed, whereby high-speed movement and highly accurate position control is possible.

According to one embodiment of the present disclosure, a stage device including: a loading part configured to load a substrate; and a driving part configured to move the loading part in an X-axis direction and a Y-axis direction, wherein the driving part includes a boxy body being rectangular as seen in a plan view and configured to support the loading part such that the loading part is movable in the X-axis direction and the entire boxy body being movable in the Y-axis direction, a pair of elongated Y-axis wall bodies configured to be arranged parallel to each other in the Y-axis direction so as to sandwich the boxy body, a pair of X-axis linear motors configured to move the loading part in the X-axis direction inside the boxy body, and a pair of Y-axis linear motors configured to move the boxy body in the Y-axis direction, wherein the boxy body is a box shape with an upper part opened and includes a pair of X-axis-direction side walls extending in the X-axis direction to be parallel with each other, a pair of Y-axis-direction side walls extending in the Y-axis direction to be parallel with each other and a bottom wall, the pair of X-axis linear motors are provided at the same position in a Z-axis direction orthogonal to the X-axis direction and the Y-axis direction, and the pair of Y-axis linear motors are provided at the same position in the Z-axis direction.

According to another embodiment of the present disclosure, a stage device including: a loading part configured to load a substrate; and a driving part configured to move the loading part in an X-axis direction and a Y-axis direction, a Z-axis driving part configured to move the loading part in the Z-axis direction, wherein the driving part includes a boxy body being rectangular as seen in a plan view and configured to support the loading part such that the loading part is movable in the X-axis direction and the entire boxy body being movable in the Y-axis direction, a pair of elongated Y-axis wall bodies configured to be arranged parallel to each other in the Y-axis direction so as to sandwich the boxy body, a pair of X-axis linear motors configured to move the loading part in the X-axis direction inside the boxy body, and a pair of Y-axis linear motors configured to move the boxy body in the Y-axis direction, wherein the boxy body includes a pair of X-axis-direction side walls extending in the X-axis direction to be parallel with each other and a pair of Y-axis-direction side walls extending in the Y-axis direction to be parallel with each other, the pair of X-axis linear motors are provided at the same position in a Z-axis direction orthogonal to the X-axis direction and the Y-axis direction, the pair of Y-axis linear motors are provided at the same position in the Z-axis direction, and the Z-axis driving part is disposed inside the boxy body and is disposed to be surrounded by the pair of X-axis-direction side walls and the Y-axis-direction side walls.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
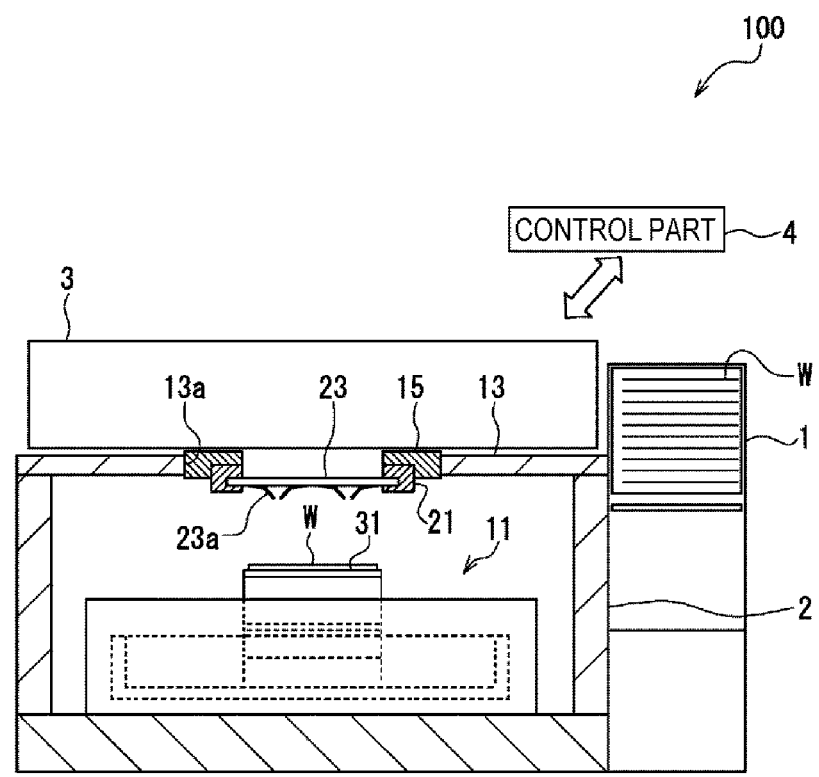
FIG. 1 is a cross-sectional view showing the schematic configuration of a probe device according to an embodiment of the present disclosure.

Hereinafter, embodiments of the present disclosure will be described with reference to the accompanying drawings. FIG. 1 is a cross-sectional view showing the schematic configuration of a probe device 100 according to an embodiment of the present disclosure. The probe device 100 of the present embodiment is for inspecting the electrical characteristics of a device (not shown) such as a semiconductor device formed on a semiconductor wafer (hereinafter, simply referred to as a "wafer") W.

The probe device 100 includes a loader chamber 1 that forms a transfer region for transferring a wafer W, an inspection chamber 2 that accommodates the wafer W, a test head 3 that is disposed so as to cover the inspection chamber 2 from above and transmits an electrical signal and receives a response signal to and from each device on the wafer W, and a control part 4 that controls these components of the probe device 100.

The inspection chamber 2 includes a stage device 11 that has a loading part 31 for loading the wafer W and can move the loading part 31 in the horizontal direction (X-axis direction, Y-axis direction, and θ direction) and the vertical direction (Z-axis direction). The inspection chamber 2 also includes a head plate 13 provided above the stage device 11 and an insertion ring 15 fixed to an opening 13a formed substantially in the center of the head plate 13. A probe card 23 is held to the insertion ring 15 by a probe card holder 21. The probe card 23 has a plurality of probes (contactors) 23a. In the state of being held to the insertion ring 15, the probe card 23 is electrically connected to the test head 3.

Although not shown, the inspection chamber 2 includes an alignment mechanism for aligning the plurality of probes 23a with electrode pads of a plurality of devices formed on the wafer W, or an internal transfer mechanism 29 for receiving the probe card 23 from an external transfer device and attaching the probe card 23 to the insertion ring 15.

Figure 2:
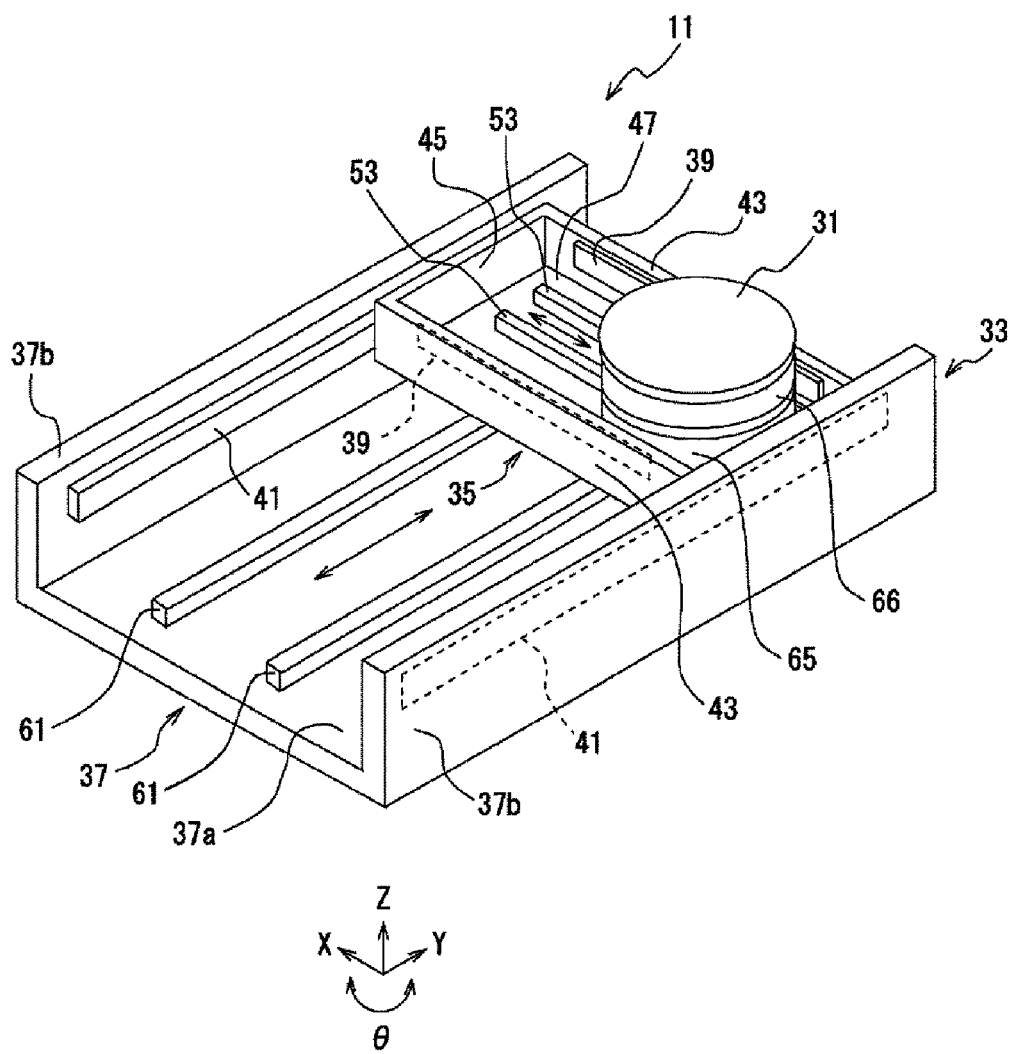
FIG. 2 is a schematic perspective view showing a stage device in the probe device of FIG. 1.
Figure 3:
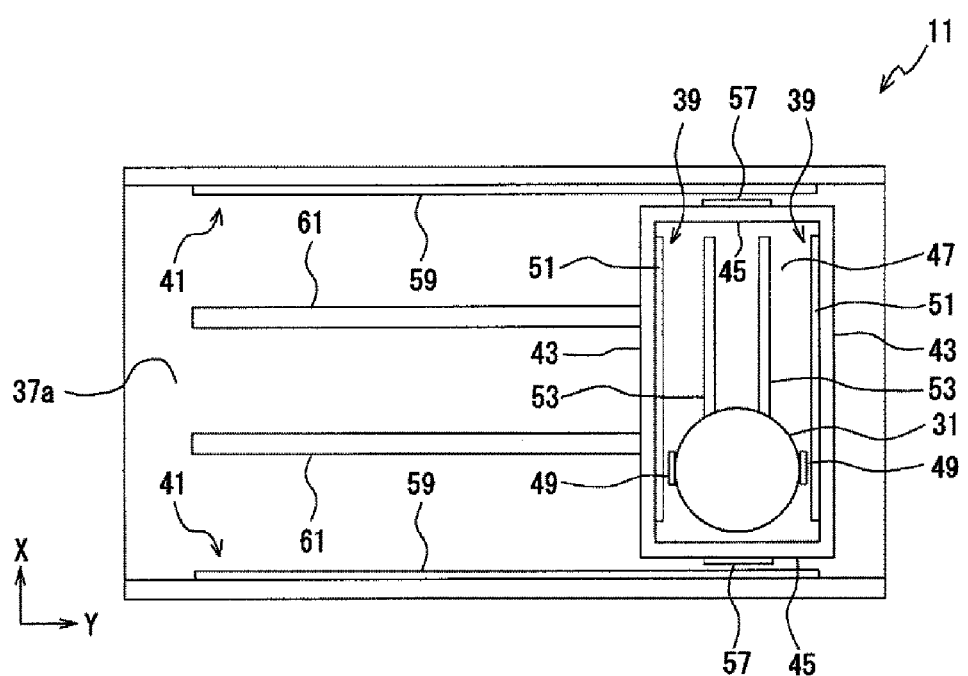
FIG. 3 is a plan view showing a stage device.
Figure 4:
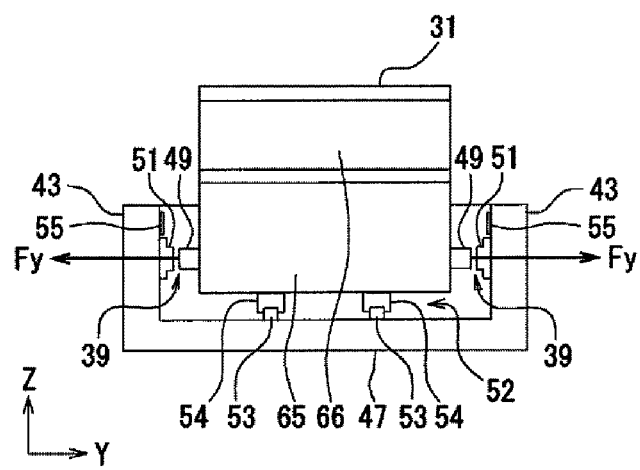
FIG. 4 is an explanatory view showing a cross section of a main part of a stage device.
Figure 5:
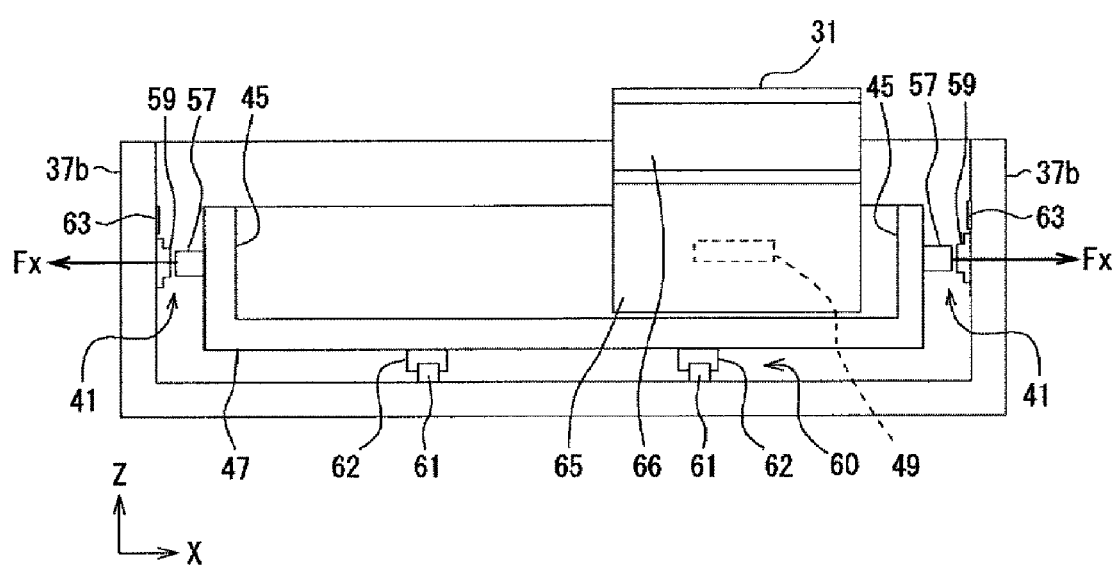
FIG. 5 is an explanatory view showing a cross section of another main part of a stage device.

Next, the stage device 11 in the probe device 100 of FIG. 1 will be described in detail with reference to FIGS. 2 to 5. FIG. 2 is a schematic perspective view showing the stage device 11. FIG. 3 is a plan view showing the stage device 11. FIGS. 4 and 5 are cross-sectional views of main parts of the stage device 11. The stage device 11 includes the loading part 31 for loading the wafer W and a driving part 33 for moving the loading part 31 in the horizontal direction and the vertical direction.

<Loading Part 31>

The loading part 31 is provided with a substantially circular loading surface for loading the wafer W. The loading part 31 is configured to be movable in each of the X, Y, Z, and θ directions by a driving part 33 in the state in which the wafer W is loaded.

<Driving Part>

The driving part 33 includes a rectangular boxy body 35 as seen in a plan view, a base 37, a pair of X-axis linear motors 39 and 39, a pair of Y-axis linear motors 41 and 41, an X-axis slide mechanism 52, and a Y-axis slide mechanism 60. The X-axis linear motors 39 and 39 and the Y-axis linear motors 41 and 41 are all servo motors that can perform servo control.

(Boxy Body)

The boxy body 35 supports the loading part 31 so as to be able to reciprocate in the X-axis direction, and is configured to reciprocate in the Y-axis direction as a whole. The boxy body 35 includes a pair of X-axis-direction side walls 43 and 43 provided parallel to each other in the X-axis direction, a pair of Y-axis-direction side walls 45 and 45 provided parallel to each other in the Y-axis direction, and a bottom wall 47. The boxy body 35 has a box shape with its upper part opened. The boxy body 35 is formed of a metal such as stainless steel (SUS) or the like. By the rectangular shape of the boxy body 35 as seen in its plan view, the boxy body 35 can ensure sufficient rigidity against a magnetic attractive force generated by the X-axis linear motor 39.

(Base)

The base 37 has a U-shaped cross section, and has a bottom portion 37a and a pair of elongated Y-axis wall bodies 37b and 37b erected from the bottom portion 37a. The pair of Y-axis wall bodies 37b and 37b are arranged parallel to each other in the Y-axis direction such that the boxy body 35 is interposed between both sides thereof, and support the boxy body 35 allowing the boxy body 35 to reciprocate in the Y-axis direction. The Y-axis wall body 37b is formed of a metal such as SUS to ensure sufficient rigidity.

(X-Axis Linear Motor)

The X-axis linear motor 39 is a core-equipped linear motor that moves the loading part 31 in the X-axis direction inside the boxy body 35. As shown in FIG. 4, the X-axis linear motor 39 includes an X-axis mover 49 moving along with the loading part 31, an X-axis stator 51 disposed to face the X-axis mover 49, and an X-axis linear scale 55. The X-axis linear motor 39 is controlled by a servo control part (not shown).

The X-axis stator 51 is provided on inner walls of the pair of X-axis-direction side walls 43 of the boxy body 35 that face each other. The pair of X-axis stators 51 are arranged such that the positions (height positions) in the Z-axis direction are the same as each other.

In addition, the X-axis mover 49 is fixed to a side portion of a Z-axis driving part 65 (described later) disposed below the loading part 31 so as to face the X-axis stator 51. That is, the X-axis mover 49 is connected to the loading part 31 through the Z-axis driving part 65. Accordingly, the X-axis mover 49 is configured to reciprocate in the X-axis direction along the inner wall of the X-axis-direction side wall 43 together with the loading part 31. The fixed position of the X-axis mover 49 is not limited as long as the X-axis mover 49 can allow moving along with the loading part 31 to reciprocate in the X-axis direction. For example, the X-axis mover 49 may be indirectly connected to the loading part 31 via a connection member.

As described above, in the stage device 11, the X-axis linear motor 39 is arranged at the same height position (that is, the same position in the Z-axis direction) on the wall surfaces of the two X-axis-direction side walls 43 facing each other in the boxy body 35. Therefore, a magnetic attractive force Fy attracting each X-axis mover 49 toward the X-axis stator 51 (in the Y-axis direction) side is canceled out between the pair of X-axis linear motors 39, whereby the occurrence of cogging or yawing is suppressed. Further, since the X-axis linear motor 39 is a core-equipped linear motor having a large thrust, it is possible to perform position control with high accuracy while moving the loading part 31 at a high speed in the X-axis direction.

(X-Axis Slide Mechanism)

The X-axis slide mechanism 52 includes a pair of left and right X-axis guides 53 which are arranged on the bottom wall 47 of the boxy body 35 and extend in the X-axis direction, and a slider 54 which is fixed to the Z-axis driving part 65 (described later) and slides along the X-axis guide 53. The loading part 31 can linearly reciprocate in the X-axis direction inside the boxy body 35 together with the Z-axis driving part 65 and a θ driving part 66 (described later) owing to the X-axis slide mechanism 52.

(Y-Axis Linear Motor)

The Y-axis linear motor 41 is a core-equipped linear motor that moves the boxy body 35 in the Y-axis direction. As shown in FIG. 5, the Y-axis linear motor 41 includes a Y-axis mover 57 fixed to the boxy body 35, a Y-axis stator 59 disposed to face the Y-axis mover 57, and a Y-axis linear scale 63. The Y-axis linear motor 41 is controlled by a servo control part (not shown).

The Y-axis stator 59 is provided on the wall surfaces of the pair of Y-axis wall bodies 37b that face each other. The pair of Y-axis stators 59 are arranged such that the positions (height positions) in the Z-axis direction are the same as each other.

In addition, the Y-axis mover 57 is arranged outside the Y-axis-direction side wall 45 of the boxy body 35 to face the Y-axis stator 59. Each Y-axis mover 57 is configured to reciprocate in the Y-axis direction along wall surfaces of the Y-axis wall body 37b opposite each other. Each Y-axis mover 57 is provided outside the Y-axis-direction side wall 45 of the boxy body 35 so that the boxy body 35 reciprocates in the Y-axis direction together with the Y-axis mover 57.

As described above, in the stage device 11, the pair of Y-axis linear motors 41 and 41 are arranged at the same height position (that is, the same position in the Z-axis direction). Therefore, a magnetic attractive force Fx attracting the Y-axis mover 57 toward the Y-axis stator 59 (X-axis direction) side is canceled out between the pair of Y-axis linear motors 41, whereby the occurrence of cogging or yawing is suppressed. Further, since the Y-axis linear motor 41 is a core-equipped linear motor with a large thrust, it is possible to perform position control with high accuracy while moving the boxy body 35 which supports the loading part 31 at a high speed in the Y-axis direction. In addition, each Y-axis mover 57 is provided outside the pair of Y-axis-direction side walls 45 and 45 of the highly rigid boxy body 35, whereby it is possible to sufficiently resist the magnetic attractive force Fx toward the Y-axis stator 59 side (X-axis direction) thanks to the rigidity of the boxy body 35. That is, since the boxy body 35 having a rectangular shape as seen in a plan view has a high mechanical strength, the pair of Y-axis-direction side walls 45 and 45 sufficiently resists an outward expansion force together with the Y-axis movers 57 and 57, so that stable propulsion driving in the Y-axis direction becomes possible.

In addition, as shown in FIGS. 2, 4, and 5, the X-axis linear motor 39 and the Y-axis linear motor 41 are provided at substantially the same height. In other words, the X-axis linear motor 39 and the Y-axis linear motor 41 are arranged at height positions that overlap with each other when it is assumed that they are moved parallel to each other in the X and Y directions. Thus, compared with a case where an X-axis driving system and a Y-axis driving system are stacked in the Z-axis direction, a low center of gravity is achieved, and thus vibration of the loading part 31 is suppressed at the time of driving. It is to be noted that "height positions that overlap each other when it is assumed that they are moved parallel to each other in the X and Y directions" may not mean that the height positions of the upper and lower ends of the X-axis mover 49 and the Y-axis mover 57 completely coincide with the height positions of the upper and lower ends of the X-axis stator 51 and the Y-axis stator 59, but may mean that these height positions may at least partially overlap each other. That is, it suffices for at least a part of the X-axis mover 49 and the Y-axis mover 57 to be located in the same XY plane, or for at least a part of the X-axis stator 51 and the Y-axis stator 59 to be located in the same XY plane.

(Y-Axis Slide Mechanism)

The Y-axis slide mechanism 60 includes a pair of left and right Y-axis guides 61 which are arranged on the bottom portion 37a of the base 37 and extend in the Y-axis direction, and a slider 62 which is fixed to the boxy body 35 and slides along the Y-axis guides 61. The boxy body 35 can linearly reciprocate in the Y-axis direction by the Y-axis slide mechanism 60.

(Z-Axis Driving Part)

The driving part 33 includes the Z-axis driving part 65 for elevating and displacing the loading part 31 in the Z-axis direction. The Z-axis driving part 65 has a motor that is not shown and moves the loading part 31 in the Z-axis direction. The Z-axis driving part 65 is disposed below the loading part 31 and is connected to the loading part 31. The Z-axis driving part 65 is configured to reciprocate in the X-axis direction in synchronization with the loading part 31 inside the boxy body 35 by the X-axis linear motor 39. Also, the Z-axis driving part 65 is configured to reciprocate in the Y-axis direction together with the boxy body 35 by the Y-axis linear motor 41.

The Z-axis driving part 65 is disposed inside the boxy body 35 in the state of being surrounded by the pair of X-axis-direction side walls 43 and 43 and the pair of Y-axis-direction side walls 45 and 45. That is, the Z-axis driving part 65, which is heavy, is disposed at a height position substantially equal to those of the X-axis linear motor 39 and the Y-axis linear motor 41. Specifically, at least a part of the Z-axis driving part 65 is provided at a height position located in the same XY plane as the X-axis linear motor 39 and the Y-axis linear motor 41. Thus, compared with the case where the X-axis driving system, the Y-axis driving system, and the Z-axis driving system are stacked in the Z-axis direction, a lower center of gravity is achieved.

(θ Driving Part)

In addition, the driving part 33 includes a θ driving part 66 for rotating the loading part 31 in the θ direction. The θ driving part 66 has a motor that is not shown and rotates the loading part 31 in the horizontal direction. The θ driving part 66 is disposed below the loading part 31 and above the Z-axis driving part 65. The θ driving part 66 is configured to reciprocate in the X-axis direction in synchronism with the loading part 31 by the X-axis linear motor 39. The θ driving part 66 is configured to reciprocate in the Y-axis direction together with the boxy body 35 by the Y-axis linear motor 41.

<Control Part>

Figure 6:
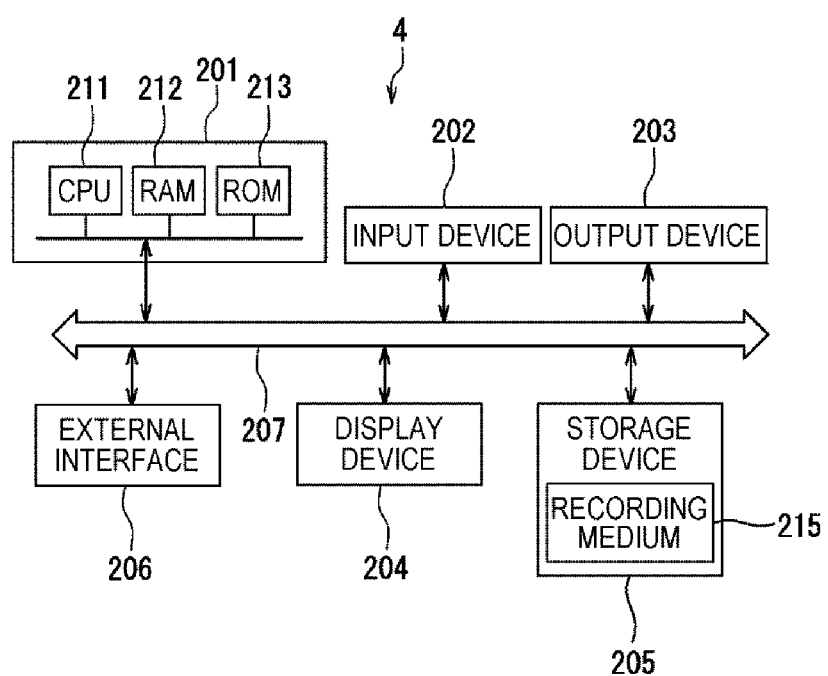
FIG. 6 is a block diagram showing a hardware configuration of a control part.

The control part 4 controls the operation of each component of the probe device 100. The control part 4 is typically a computer. FIG. 6 shows an example of a hardware configuration of the control part 4. The control part 4 includes a main control part 201, an input device 202 such as a keyboard or a mouse, an output device 203 such as a printer, a display device 204, a storage device 205, an external interface 206, and a bus 207 connecting these components to each other. The main control part 201 has a Central Processing Unit (CPU) 211, a Random Access Memory (RAM) 212, and a Read-Only Memory (ROM) 213. The form of the storage device 205 is not limited, as long as the storage device 205 can store information, and the storage device 205 is, for example, a hard disc device or an optical disc device. Further, the storage device 205 records information on a computer-readable recording medium 215 and reads information from the recording medium 215. The form of the recording medium 215 is not limited as long as the recording medium 215 can store information, and the recording medium 215 is, for example, a hard disc, an optical disc, a flash memory, or the like. The recording medium 215 may be a recording medium that records a recipe of a probe method performed in the probe device 100 of the present embodiment.

The control part 4 controls the probe device 100 according to the present embodiment to perform device inspection on a plurality of wafers W. Specifically, the control part 4 controls the respective components (for example, the test head 3, the stage device 11, etc.) in the probe device 100. These are realized by the CPU 211 using the RAM 212 as a work area and executing software (program) stored in the ROM 213 or the storage device 205.

Figure 7:
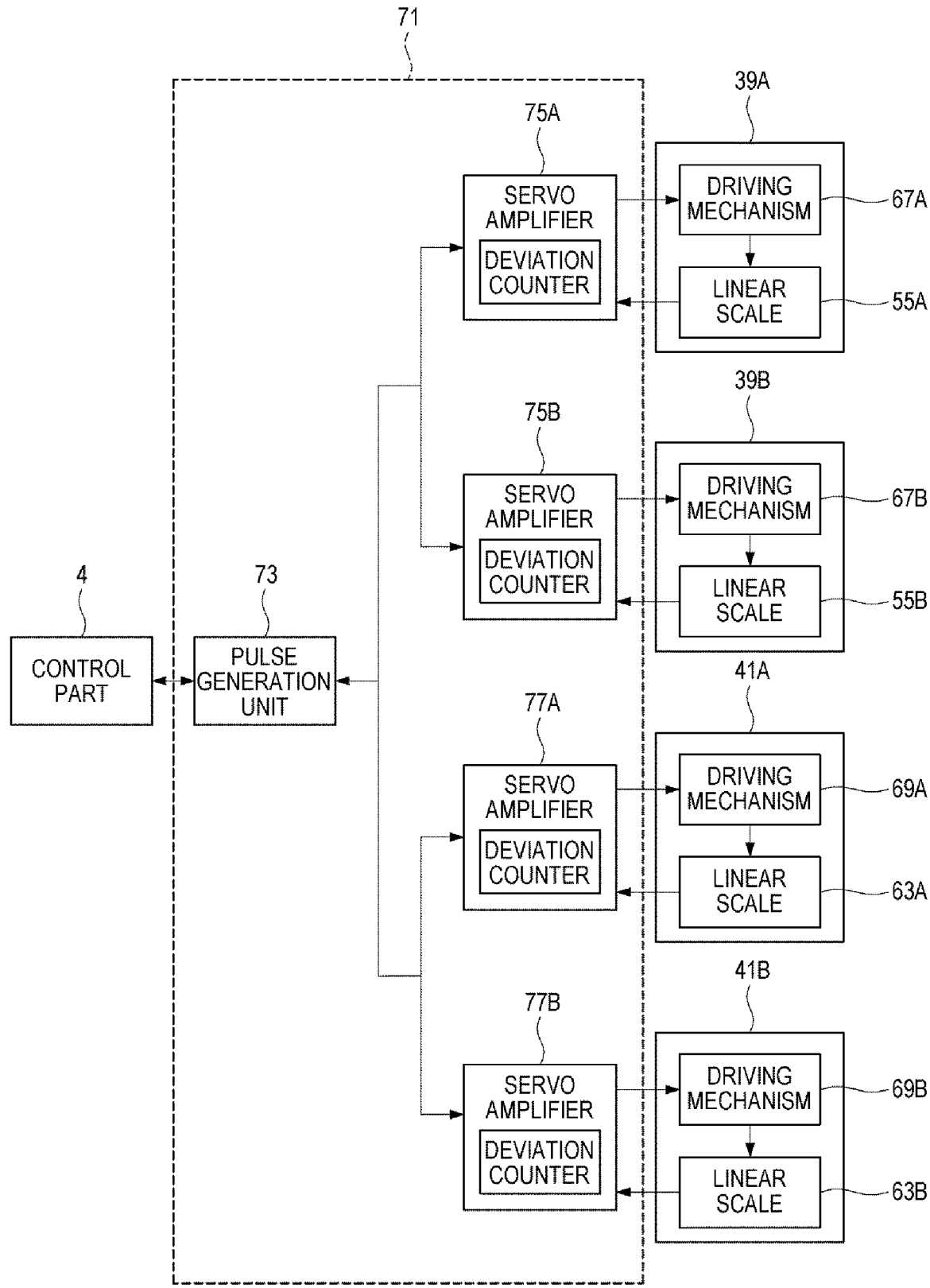
FIG. 7 is a block diagram showing a control system for horizontally driving a stage device in X and Y directions.

FIG. 7 is a block diagram showing a control system for horizontally driving the stage device 11 in X and Y directions. In FIG. 7, for convenience of description, the pair of X-axis linear motors 39 are denoted as the X-axis linear motors 39A and 39B, and the pair of Y-axis linear motors 41 are denoted as the Y-axis linear motors 41A and 41B so as to distinguish them from each other. Similarly, in FIG. 7, the linear scale 55 of the X-axis linear motors 39A and 39B is denoted as linear scales 55A and 55B, and the linear scale 63 of the Y-axis linear motors 41A and 41B is denoted as linear scale 63A and 63B. In addition, driving mechanisms 67A and 67B in the X-axis linear motors 39A and 39B respectively refer to the X-axis mover 49 and the X-axis stator 51 in the X-axis linear motors 39A and 39B, and driving mechanisms 69A and 69B in the Y-axis linear motors 41A and 41B respectively refer to the Y-axis mover 57 and the Y-axis stator 59.

As shown in FIG. 7, the X-axis linear motors 39A and 39B and the Y-axis linear motors 41A and 41B are controlled by a common servo control part 71. The servo control part 71 includes a pulse generation part 73 for generating a command pulse, and servo amplifiers 75A and 75B, and servo amplifiers 77A and 77B corresponding to the X-axis linear motors 39A and 39B and the Y-axis linear motors 41A and 41B, respectively.

The pulse generation part 73 is a programmable logic controller (PLC), and generates a command pulse for driving the X-axis linear motors 39A and 39B and the Y-axis linear motors 41A and 41B under the control of the control part 4 in higher hierarchy and outputs the generated command pulse to each of the servo amplifiers 75A and 75B and the servo amplifiers 77A and 77B. The pulse generation part 73 outputs a command pulse common to the pair of servo amplifiers 75A and 75B. Similarly, the pulse generation part 73 also outputs a common command pulse to the pair of servo amplifiers 77A and 77B.

The servo amplifiers 75A and 75B (or 77A and 77B) have a deviation counter and a D/A converter that is not shown, etc. In the deviation counter, the command pulses from the pulse generation part 73 are accumulated.

When the command pulse is input to the servo amplifiers 75A, 75B, 77A, and 77B, the driving mechanisms 67A, 67B, 69A, and 69B are driven at a speed and a torque corresponding to the command pulse in order to horizontally move the stage devices 11 in the X and Y directions.

When the driving mechanisms 67A, 67B, 69A, and 69B are driven, the linear scales 55A, 55B, 63A, and 63B generate feedback pulses proportional to the amount of movement of the mover, and at the same time, the generated feedback pulses are fed back to each of the corresponding servo amplifiers 75A, 75B, 77A, and 77B.

In the stage device 11, based on a command from the control part 4, the pulse generation part 73 generates command pulses for driving the driving mechanisms 67A and 67B or the driving mechanisms 69A and 69B, and inputs the generated command pulses to the servo amplifiers 75A and 75B or the servo amplifiers 77A and 77B. The command pulses are accumulated in the deviation counter in the servo amplifiers 75A and 75B or the servo amplifiers 77A and 77B, and the driving mechanisms 67A and 67B or the driving mechanisms 69A and 69B are driven by an accumulated value (cumulative pulse) of the command pulses. When the driving mechanisms 67A and 67B or the driving mechanisms 69A and 69B are driven, feedback pulses proportional to the driving amount are generated by the corresponding linear scales 55A and 55B or the linear scales 63A and 63B. These feedback pulses are fed back to each of the servo amplifiers 75A and 75B or each of the servo amplifiers 77A and 77B to subtract the cumulative pulses of the deviation counter. When the cumulative pulses of the deviation counter converge near zero, the driving mechanisms 67A and 67B or the driving mechanisms 69A and 69B stop.

As described above, in the stage device 11, the pair of left and right X-axis linear motors 39 are controlled by the common command pulse so that the pair of left and right X-axis movers 49 can be synchronized and driven. Thus, high-speed and high-precision driving in the X-axis direction may be achieved by a gantry structure (structure in which both ends are supported). Similarly, the pair of left and right Y-axis linear motors 41 are controlled by the common command pulse so that the pair of left and right Y-axis movers 57 can be synchronized and driven. Thus, high-speed and high-precision driving in the Y-axis direction may be achieved by a gantry structure (structure in which both ends are supported).

Since the stage device 11 of the present embodiment having the above-described configuration has a structure in which the pair of core-equipped linear motors are arranged at the same height in the vertical direction, the occurrence of cogging, yawing, and pitching is effectively suppressed. This is because the magnetic attractive forces Fx and Fy are canceled out between the pair of X-axis linear motors 39 and between the pair of Y-axis linear motors 41 as described above.

In addition, in the stage device 11, the X-axis linear motor 39 and the Y-axis linear motor 41 are provided at substantially the same height position, and the Z-axis driving part 65 is provided inside the boxy body 35, whereby the center of gravity of the entire driving part 33 is lowered. Therefore, the eccentricity of the center of gravity position in the driving part 33 can be minimized, so that a stage-driving mechanism having excellent vibration resistance is realized.

In addition, in the stage device 11, the driving in the X-axis direction is performed by the gantry structure and the pair of left and right X-axis linear motors 39. By employing such a support structure, a sufficiently large thrust can be obtained with respect to the loading part 31, which moves together with the Z-axis driving part 65 which is heavy, and yawing at the time of driving in the X-axis direction is more effectively suppressed. Similarly, in the stage device 11, the driving in the Y-axis direction is performed by the gantry structure caused by the pair of left and right Y-axis linear motors 41. By employing this support structure, a sufficiently large thrust can be obtained with respect to the loading part 31 that moves together with the Z-axis driving part 65 which is heavy, and yawing at the time of driving in the Y-axis direction is more effectively suppressed.

In addition, in the stage device 11, the Z-axis driving part 65 which is heavy is accommodated inside the rectangular boxy body 35, as seen in a plan view, and, when the loading part 31 is moved in the X and Y directions, the X-axis linear motor 39 and the Y-axis linear motor 41 are driven via the highly rigid boxy body 35. Therefore, the influence of the magnetic attractive force and vibration can be minimized by the rigidity of the boxy body 35.

Figure 8:
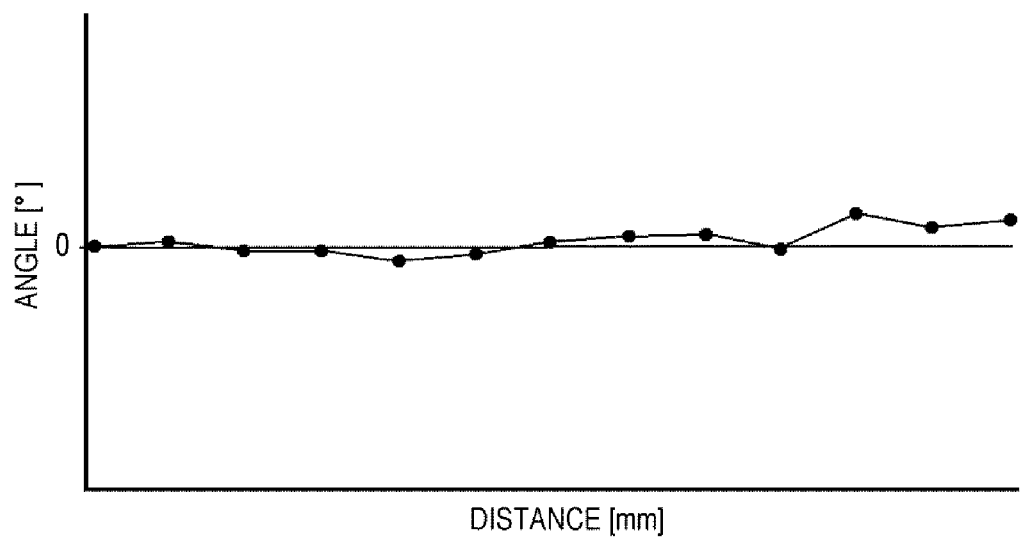
FIG. 8 is a graph showing measurement results of yawing occurring when a loading part is linearly moved in a Y-axis direction at the time of ON servo control.
Figure 9:
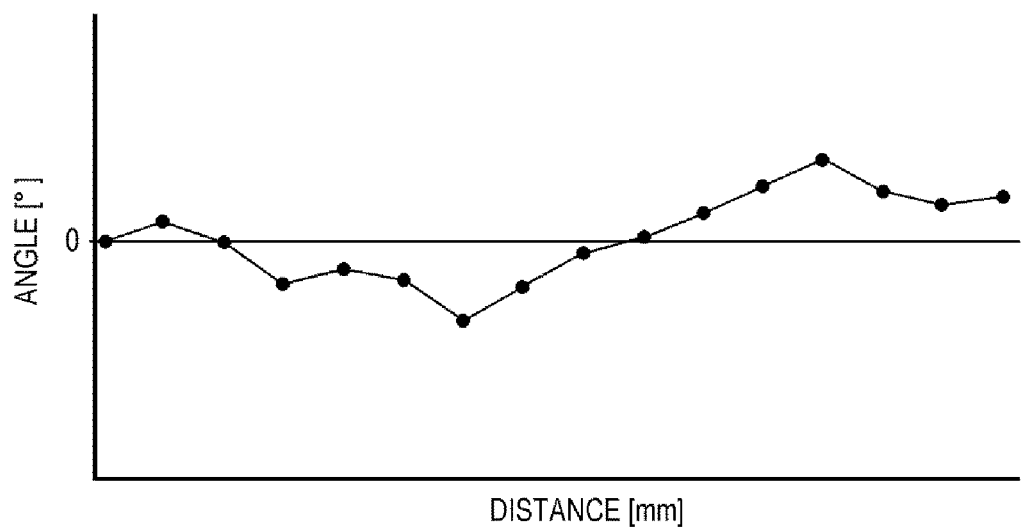
FIG. 9 is a graph showing measurement results of yawing occurring when a loading part is linearly moved in a Y-axis direction at the time of OFF servo control.

Next, test results obtained by confirming the effects of the present disclosure will be described with reference to FIGS. 8 and 9. FIG. 8 is a graph showing the stage accuracy when the loading part 31 is linearly moved in the Y-axis direction while servo control (servo control ON) is performed. FIG. 9 is a graph showing the stage accuracy when the loading part 31 is linearly moved in the Y-axis direction without servo control (servo control OFF). The vertical axis of FIGS. 8 and 9 represents the angle of generated yawing, and the horizontal axis thereof represents the distance of movement.

From FIGS. 8 and 9, in the servo control ON state (FIG. 8), it was confirmed that, when the stage device 11 is driven in the Y-axis direction by the pair of Y-axis linear motors 41, yawing is effectively suppressed and stable driving is possible, as compared with the servo control OFF state (FIG. 9).

<Probe Inspection Procedure>

In the probe device 100 having the above-described configuration, by transferring the probe card holder 21 holding the probe card 23 from an external transfer device to an internal transfer mechanism (not shown), the internal transfer mechanism transfers the probe card holder 21 and attaches the transferred probe card holder 21 to the insertion ring 15.

Next, by moving the loading part 31 of the stage device 11 in the horizontal direction (X-axis direction, Y-axis direction, and θ direction) and the vertical direction (Z-axis direction), the relative position between the probe card 23 and the wafer W, held on the loading part 31 of the stage device 11, is adjusted, so that the electrode of the device and a probe 23a are brought into contact with each other. At this time, the horizontal movement in the X and Y directions is performed by the pair of X-axis linear motors 39 and the pair of Y-axis linear motors 41, so that cogging, yawing, and pitching are suppressed, and high-speed and high-precision positioning is possible.

Next, the test head 3 supplies an inspection current to the device through each probe 23a of the probe card 23. The probe card 23 transmits an electrical signal indicating the electrical characteristics of the device to the test head 3. The test head 3 stores the transmitted electrical signal as measurement data and determines the presence or absence of an electrical defect of the inspection target device.

As described above, in the stage device 11 according to the present embodiment, the influence of the magnetic attractive force is suppressed, so that high-speed and high-precision position control is possible. Therefore, using the probe device 100 of the present embodiment, highly reliable probe inspection becomes possible.

Although the embodiments of the present disclosure have been described above in detail for the purpose of illustration, the present disclosure is not limited to the above embodiments, and various modifications are possible. For example, the substrate is not limited to a semiconductor wafer, but may be a substrate for a flat-panel display typified by a glass substrate used for a liquid-crystal display device, a resin substrate on which a large number of semiconductor integrated circuit (IC) chips are mounted, or a substrate for use with mounting inspection such as a glass substrate.

This international application claims priority based on Japanese Patent Application No. 2015-187289 filed on Sep. 24, 2015, the entire contents of which are hereby incorporated by reference.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage device comprising:
a loading part configured to load a substrate;
a driving part configured to move the loading part in an X-axis direction and a Y-axis direction; and
a Z-axis driving part configured to move the loading part in a Z-axis direction orthogonal to the X-axis direction and the Y-axis direction, wherein
the driving part includes
a boxy body being rectangular as seen in a plan view and configured to support the loading part such that the loading part is movable in the X-axis direction and the entire boxy body being movable in the Y-axis direction,
a pair of elongated Y-axis wall bodies configured to be arranged parallel to each other in the Y-axis direction so as to sandwich the boxy body,
a pair of X-axis linear motors configured to move the loading part in the X-axis direction inside the boxy body, and
a pair of Y-axis linear motors configured to move the boxy body in the Y-axis direction, wherein
the boxy body is a box shape with an upper part opened and includes a pair of X-axis-direction side walls extending in the X-axis direction to be parallel with each other, a pair of Y-axis-direction side walls extending in the Y-axis direction to be parallel with each other and a bottom wall,
the pair of X-axis linear motors are provided at the same position in the Z-axis direction,
the pair of Y-axis linear motors are provided at the same position in the Z-axis direction, and
the Z-axis driving part is surrounded by the pair of X-axis-direction side walls and the pair of Y-axis-direction side walls inside the boxy body such that the Z-axis driving part is surrounded by the pair of X-axis linear motors and the pair of Y-axis linear motors, and is disposed below the loading part so as to overlap the loading part in a plan view.

2. The stage device of claim 1, wherein, when it is assumed that the X-axis linear motor and the Y-axis linear motor are moved parallel to each other in the X and Y directions, the X-axis linear motor and the Y-axis linear motor are provided at height positions overlapping each other.

3. The stage device of claim 1, wherein the X-axis linear motor is a core-equipped linear motor including an X-axis mover moving along with the loading part and an X-axis stator disposed to face the X-axis mover, the X-axis stator is provided on wall surfaces opposite each other, of the pair of X-axis-direction side walls, and the X-axis mover is provided to be movable along the wall surfaces.

4. The stage device of claim 1, wherein the Y-axis linear motor is a core-equipped linear motor including a Y-axis mover fixed outside the pair of Y-axis-direction side walls and a Y-axis stator disposed to face the Y-axis mover, the Y-axis stator is provided on wall surfaces opposite each other, of the pair of Y-axis wall bodies, and the Y-axis mover is provided to be movable along the wall surfaces.

5. The stage device of claim 1, wherein the pair of X-axis linear motors are controlled by a common command pulse.

6. The stage device of claim 1, wherein the pair of Y-axis linear motors are controlled by a common command pulse.

7. A probe device including the stage device described in claim 1.

8. The stage device of claim 1, wherein the X-axis linear motor includes an X-axis mover for moving the loading part and an X-axis stator disposed to face the X-axis mover, and
the X-axis mover is fixed to a side portion of the Z-axis driving part.

* * * * *